(12) United States Patent
Monreal et al.

(10) Patent No.: US 7,425,821 B2
(45) Date of Patent: Sep. 16, 2008

(54) CHOPPED HALL EFFECT SENSOR

(75) Inventors: Gerardo Monreal, Buenos Aires (AR); Hernan D. Romero, Buenos Aires (AR)

(73) Assignee: Allegro Microsystems, Inc., Worcester, MA (US)

( * ) Notice: Subject to any disclaimer, the term of this patent is extended or adjusted under 35 U.S.C. 154(b) by 68 days.

(21) Appl. No.: 11/550,849

(22) Filed: Oct. 19, 2006

(65) Prior Publication Data
US 2008/0094055 A1    Apr. 24, 2008

(51) Int. Cl.
*G01R 33/07*    (2006.01)
(52) U.S. Cl. ................................... 324/117 H
(58) Field of Classification Search .............. 324/117 H
See application file for complete search history.

(56) References Cited

U.S. PATENT DOCUMENTS

| 5,621,319 | A | 4/1997 | Bilotti et al. | |
|---|---|---|---|---|
| 2003/0102909 | A1* | 6/2003 | Motz | 330/9 |
| 2003/0225539 | A1 | 12/2003 | Motz et al. | |
| 2007/0247141 | A1* | 10/2007 | Pastre et al. | 324/202 |

FOREIGN PATENT DOCUMENTS

WO    WO 02/03087 A1    1/2002

OTHER PUBLICATIONS

Alberto Bilotti and Gerardo Monreal, Chopper-Stabilized Amplifiers with a Track-and-Hold Signal Demodulator, Apr. 1999, IEEE Transactions on Circuits and Systems-I: Fundamental Theory and Applications, vol. 46, No. 4.*

Bilotti, et al. "Monolithic Magnetic Hall Sensor Using Dynamic Quadrature Offset Cancellation"; IEEE J. of Solid-State Circuits, vol. 32, No. 6, Jun. 1997, pp. 829-836.

International Search Report (Form PCT/ISA/210) and Written Opinion of the International Searching Authority (Form PCT/ISA/237), for PCT/US2007/014667, Jan. 23, 2008, 12 pages.

Bakker et al., "A CMOS Nested-Chopper Instrumentation Amplifier with 100-nV Offset", IEEE J. of Solid-State Circuits, XP011061382, vol. 35, No. 12, Dec. 2000, 7 pages.

* cited by examiner

*Primary Examiner*—Ha Nguyen
*Assistant Examiner*—Shaun Campbell
(74) *Attorney, Agent, or Firm*—Daly, Crowley, Mofford & Durkee, LLP

(57) ABSTRACT

A chopped Hall effect sensor topology includes a switched Hall plate, an amplifier responsive to an output of the switched Hall plate and a filter stage responsive to the output of the amplifier and including an anti-aliasing filter and a selective filter that is tuned to the modulation frequency. The switched Hall plate includes a Hall element and a Hall plate modulation circuit that modulates the Hall offset signal component or the magnetic signal component. In embodiments in which the Hall offset signal component is modulated by the switched Hall plate, the amplifier, if chopped, includes an even number of additional modulation circuits. In embodiments in which the magnetic signal component is modulated by the switched Hall plate, the amplifier contains an odd number of modulation circuits. The described topology provides a low noise, fast response time Hall effect sensor.

25 Claims, 12 Drawing Sheets

CHOPPED HALL EFFECT SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to Hall effect sensors and, more particularly, to a chopped Hall effect sensor having fast response time and reduced noise.

BACKGROUND OF THE INVENTION

Hall effect sensors are used in a wide variety of applications including industrial and consumer applications. As one example, Hall effect sensors are widely used in the automotive industry for mechanical position sensing, such as gear tooth sensors used in brake systems. Such applications require accuracy.

Hall effect elements or plates experience imbalances due to resistance gradients, geometrical asymmetries and piezoresistive effects which can introduce an offset voltage. The magnitude and polarity of the offset voltage are a function of stresses in the semiconductor from which the element is formed, which stresses vary with mechanical pressure and temperature. Various techniques have been used to address and cancel the Hall offset voltage, including chopper stabilization techniques.

One type of chopped Hall effect sensor includes a switched Hall plate, a chopped amplifier, and a low pass filter. The switched Hall plate, sometimes referred to alternatively as a spinning Hall plate, includes a Hall element having (typically) four contacts and a modulation switch circuit to periodically connect the supply voltage and the amplifier input to one pair of contacts or the other. Quadrature phases of operation are defined by complementary clock signals. Use of such a switched Hall plate provides a way to discriminate the Hall offset voltage (referred to herein as the Hall offset signal component) from the magnetically induced signal (referred to herein as the magnetic signal component). In one such circuit, the switched Hall plate modulates the magnetic signal component and the offset signal component remains substantially invariant. The chopped amplifier demodulates the magnetic signal component and modulates the offset signal component which is then attenuated by the low pass filter to provide the sensor output signal. While this technique is effective to remove the Hall offset voltage, the resulting ripple on the sensor output signal and the sensor response time must be balanced since, the more filtering applied, the lower the resulting ripple, but also the slower the sensor response time.

Some more recent Hall effect sensor applications additionally require faster response times to input magnetic field steps. As one example, Hall effect sensors used in current sensing applications must respond quickly to step changes in the magnetic field, for example in order to rapidly detect fault conditions, such as short circuits in automobile batteries.

One chopped Hall effect sensor that improves upon the above-described sensor in terms of response time is described in U.S. Pat. No. 5,621,319 entitled "Chopped Hall Sensor with Synchronously Chopped Sample and Hold Circuit" which issued on Apr. 15, 1997 to Allegro Microsystems, Inc. of Worcester, Mass., the Assignee of the subject invention. The described sensor includes a switched Hall plate and an amplifier, with the switched Hall plate arranged to modulate the magnetic signal component and maintain the offset signal component substantially invariant. Here, the modulated magnetic signal component is demodulated by sample and hold techniques. According to this technique, signal demodulation is performed by tracking and holding during both clock phases and then inverting the modulated signal during the second phase. In this way, this circuit entirely eliminates ripple on the sensor output signal and thus, provides a faster step response time by avoiding ripple filtering; however, these benefits are achieved at the cost of a degraded signal to noise ratio. This is because the sampling and holding operation can produce noise fold back (i.e., aliasing) since the baseband noise is undersampled.

SUMMARY OF THE INVENTION

A Hall effect sensor according to the invention includes a Hall element, a Hall plate modulation circuit, an amplifier, and a filter including a selective filter tuned to the modulation frequency. The Hall plate modulation circuit is responsive to the output signal of the Hall element and operates to modulate the magnetic signal component or the offset signal component of the Hall output signal. The amplifier is responsive to the modulation circuit output signal and provides an amplifier output signal to the filter. The filter includes an anti-aliasing filter coupled between the amplifier and the selective filter.

With this arrangement, the Hall effect sensor is provided with fast response time through the use of the selective filter that removes the offset signal component with its associated ripple, thereby eliminating the significant low pass filtering requirements of some conventional chopped Hall effect sensors. A high signal to noise ratio is achieved with the use of the anti-aliasing filter that removes frequency components above a predetermined frequency, so that the selective filter meets the Nyquist criterion for noise signals, thereby reducing baseband noise by preventing aliasing.

In embodiments in which the offset signal component is modulated by the modulation circuit, an even number of additional modulation circuits are provided between the output of the Hall plate modulation circuit and the input to the filter. In this way, the offset signal component is modulated when it reaches the selective filter for removal. Alternatively, in embodiments in which the magnetic signal component is modulated, the amplifier includes an odd number of additional modulation circuits between the output of the Hall plate modulation circuit and the input to the filter, again ensuring that the offset signal component is modulated when it reaches the selective filter for removal.

Embodiments of the invention may include one or more of the following features. The amplifier may be a closed or open loop amplifier. In closed loop embodiments, the loop may be closed at the input to the anti-aliasing filter, at the output of the anti-aliasing filter, or at the output of the selective filter. Also, in embodiments in which the amplifier loop is closed at the output of the anti-aliasing filter, the anti-aliasing filter may serve an additional loop compensation purpose. The filter may include a smoothing filter.

In embodiments in which the offset signal component is modulated by the modulation circuit, the amplifier may or may not be chopped. However, in embodiments in which the magnetic signal component is modulated by the modulation circuit the amplifier must be chopped. In embodiments in which the amplifier is chopped and the amplifier is a closed loop amplifier, the feedback network may or may not be chopped.

One illustrative selective filter includes a plurality of sample and hold circuits arranged in pairs, with each sample and hold circuit having an input coupled to the output of the anti-aliasing filter and an output. The filter further includes an averaging circuit having a plurality of inputs, each coupled to the output of a respective sample and hold circuit, and an output at which the selective filter output signal is provided. Each of the sample and hold circuits samples the input signal at the modulation frequency and at a phase separated from the phase of the other sample and hold circuit of the same pair by 180 degrees and at a phase arbitrarily separated from the phase at which the other pairs of sample and hold circuits operate.

In one particular embodiment, the anti-aliasing filter includes a first sample and hold circuit having an input coupled to the output of the anti-aliasing filter, a second sample and hold circuit having an input coupled to the output of the anti-aliasing filter, and an averaging circuit having inputs coupled to the outputs of the first and second sample and hold circuits. The first sample and hold circuit samples the input signal at times t=t0+N·TSF and the second sample and hold circuit samples the input signal at times t=t0+(N+1)·TSF, wherein t0 is an arbitrary time, N is an integer and TSF is 1/(2·fCLK), where $f_{CLK}$ is the modulation frequency.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
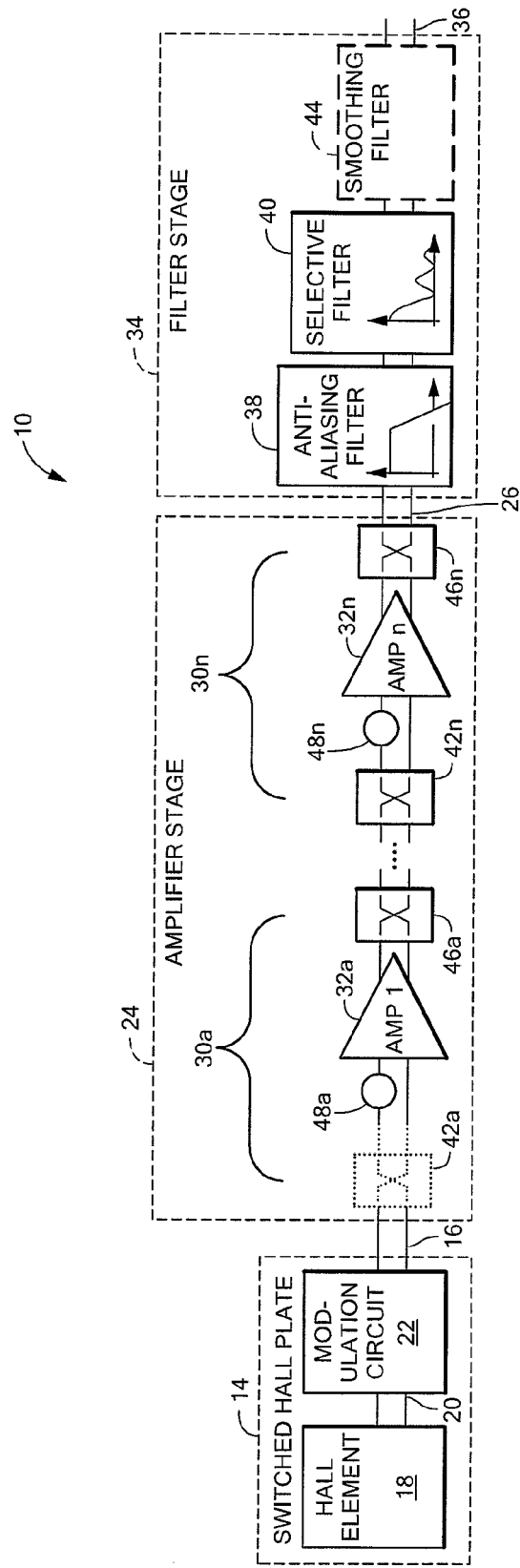
FIG. 1 is a block diagram of a chopped Hall effect sensor according to the invention.

Referring to FIG. 1, a chopped Hall effect sensor 10 includes a switched Hall plate 14 providing a switched Hall output signal 16, an amplifier stage 24 having an input responsive to the switched Hall output signal 16 and an output at which is provided an amplifier output signal 26, and a filter stage 34 having an input responsive to the amplifier output signal 26 and an output at which is provided a sensor output signal 36. The filter stage 34 includes an anti-aliasing filter 38 and a selective filter 40, as shown.

With this arrangement, the Hall effect sensor 10 is provided with low noise and fast response time. Fast response time is achieved with the use of the selective filter 40 that removes the offset signal component with its associated ripple, thereby eliminating the significant low pass filtering requirements of some conventional chopped Hall effect sensors. A high signal to noise ratio is achieved with the use of the anti-aliasing filter 38 to remove frequency components above a predetermined frequency, so that the selective filter 40 meets the Nyquist criterion for noise signals, thereby reducing resulting baseband noise by preventing aliasing. In the illustrative embodiment, the anti-aliasing filter 38 removes frequency components above the sensor clock frequency and the selective filter 40 samples at twice the clock frequency. In a preferred embodiment, the anti-aliasing filter is a low pass filter. Notably the filter requirements of the anti-aliasing filter are relaxed as compared to conventional chopped Hall sensors in which the low pass filter is the mechanism for removing the offset signal component with its associated ripple. In one illustrative embodiment, the anti-aliasing filter 38 is a first order low pass filter.

The switched Hall plate 14 includes a Hall element or plate 18 having an output at which is provided a Hall output signal 20 that varies in accordance with a sensed magnetic field and a Hall plate modulation switch circuit, or simply a Hall plate modulation circuit 22 having an input responsive to the Hall output signal and an output at which is provided the switched Hall output signal (also referred to herein as the modulation circuit output signal) 16. The switched Hall output signal 16 is coupled to an input of the amplifier stage 24, as shown. The Hall output signal 20 and switched Hall output signal 16 include a magnetic signal component $V_H$ and a Hall offset signal component $V_{op}$.

As will be described, the modulation circuit 22 may be controlled to modulate the Hall offset signal component $V_{op}$ or the magnetic signal component $V_H$ at a modulation frequency, referred to alternatively herein as the clock frequency $f_{CLK}$. An illustrative, conventional modulation circuit that modulates the Hall offset signal component $V_{op}$ is shown and described in connection with FIGS. 2-2C and an illustrative, conventional modulation circuit that modulates the magnetic signal component $V_H$ is shown and described in connection with FIGS. 3-3C.

Figure 4:
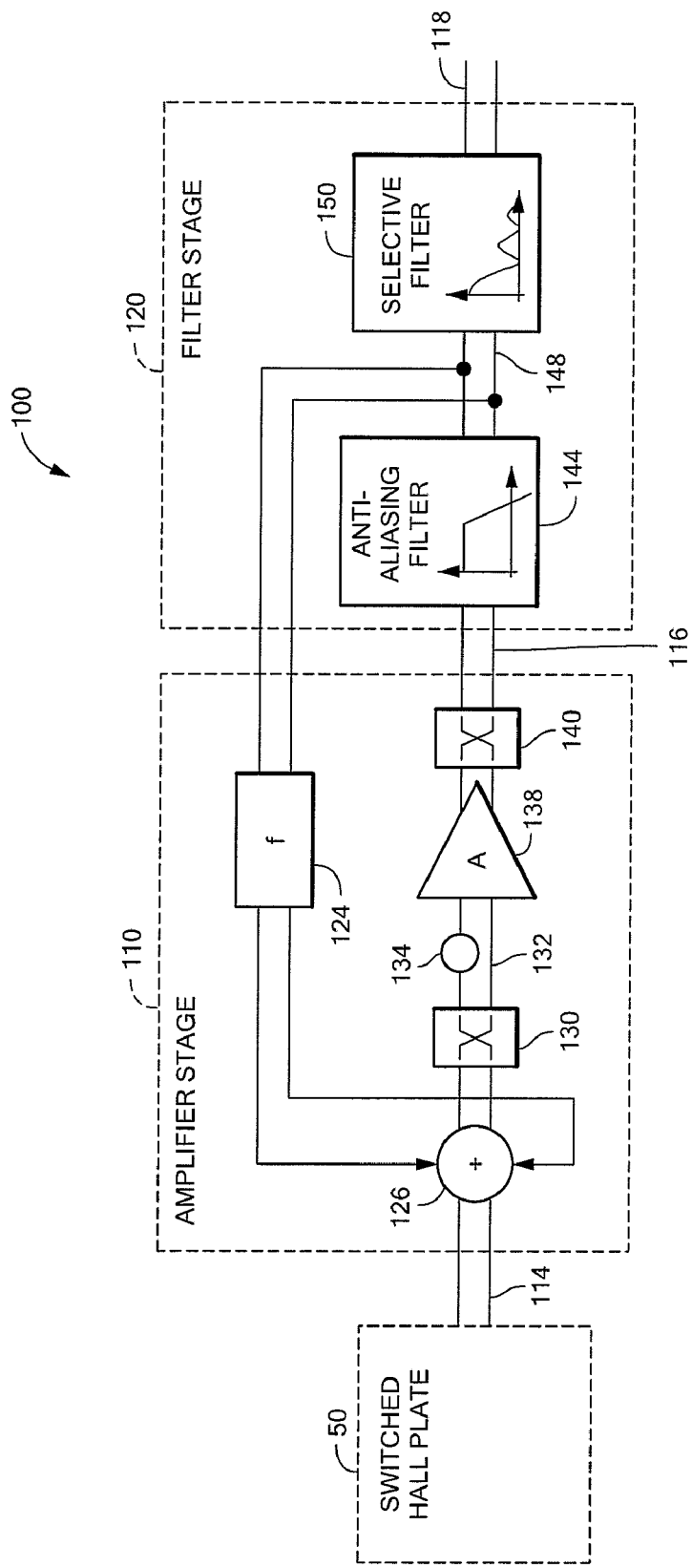
FIG. 4 is a block diagram of one embodiment of the chopped Hall effect sensor of the invention in which the switched Hall plate modulates the Hall offset signal component.

In embodiments in which the Hall plate modulation circuit 22 modulates the Hall offset signal component $V_{op}$, the Hall effect sensor 10 includes an even number of modulation circuits between the output of the Hall plate modulation circuit 22 and the input of the filter stage 34 in order to enable the selective filter 40 to remove the modulated offset signal component. One illustrative Hall effect sensor of this type is shown in FIG. 4. With this arrangement, the even number of modulation circuits in the amplifier stage operate to, one or more times, demodulate and again modulate the offset signal component to ensure that the offset signal component is modulated when it reaches the filter stage and thus, can be removed by the selective filter 40 in order to recover the magnetic signal component. In fact in such embodiments, the amplifier stage 24 may not be a chopped amplifier and thus, may not perform any signal modulation, thereby resulting in zero modulation circuits between the output of the Hall plate modulation circuit 22 and the input to the filter stage 34.

Figure 5:
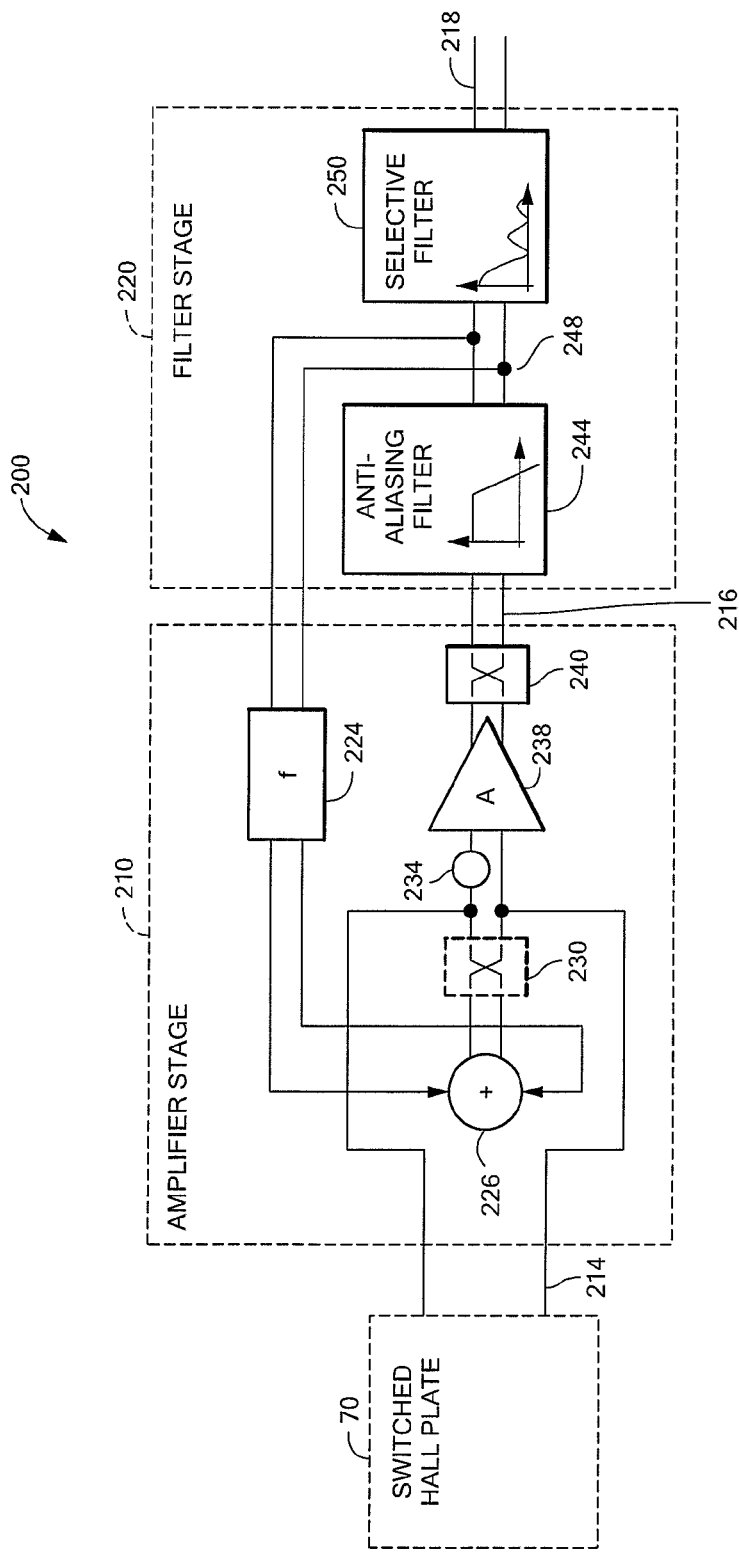
FIG. 5 is a block diagram of an alternative chopped Hall effect sensor according to the invention in which the switched Hall plate modulates the magnetic signal component.

In embodiments in which the Hall plate modulation circuit 22 modulates the magnetic signal component $V_H$, the Hall effect sensor 10 includes an odd number of modulation circuits between the output of the Hall plate modulation circuit 22 and the input of the filter stage 34 in order to enable the selective filter 40 to remove the offset signal component. One illustrative Hall effect sensor of this type is shown in FIG. 5. With this arrangement, the odd number of modulation circuits in the amplifier stage ensures that the offset signal component is modulated when it reaches the filter stage and thus, can be removed by the selective filter 40 in order to recover the magnetic signal component. As will become apparent, at least one amplifier 30a-30n comprising the amplifier stage 24 is a chopped amplifier in embodiments in which the modulation circuit 22 modulates the magnetic signal component since otherwise, the offset signal component would not be up-converted for removal by the selective filter (and optionally more than one amplifier 30a-30n is chopped, as long as an odd number of chopper stages are used).

The amplifier stage 24 may include one or more amplifiers 30a-30n. Each amplifier 30a-30n has a gain stage 32a-32n and may or may not be chopped. If chopped, the amplifier includes at least one modulation circuit, as may be provided by a pair of cross-coupled switches 46a-46n and may additionally include a second modulation circuit, as may be provided by a pair of cross-coupled switches 42a-42n, as shown in dotted lines for amplifier 30a and in solid lines for amplifier 30n. Each of the amplifiers 30a-30n, like the Hall element 18, has an associated offset voltage, here shown by respective voltage sources 48a-48n at the input to the respective gain stage 32a-32n. The modulation circuits 42a-42n and 46a-46n operate to modulate or demodulate the processed signal and may be implemented, for example with MOSFET switches. In the illustrated embodiment, the modulation circuits 42a-42n and 46a-46n operate at the clock frequency $f_{CLK}$. It will be appreciated however that the amplifier stage 24 may be chopped at a different frequency than the clock frequency used by the Hall plate modulation circuit 22.

The particular choice of number of amplifiers 30a-30n comprising the amplifier stage 24 is based generally on the desired overall gain for the amplifier 24. It is desirable that the amplifier gain be large enough so that any offset associated with any non-chopped circuitry that follows the filter stage 34 is significantly less than the Hall and amplifier offsets, thereby minimizing the contribution of such "back-end" offset. Once an overall gain is selected, how much gain is provided by any given amplifier 30a-30n requires consideration of various factors such as bandwidth and response time. For example, in closed loop configurations, the higher the gain for a particular stage, the lower the bandwidth; however, the lower the bandwidth, the slower the sensor response time. It will be appreciated that in embodiments containing more than one amplifier 30a-30n, each amplifier need not be identical in terms of topology and specifications. For example, the gain of the different amplifiers 30a-30n may vary. Also the topologies may vary. For example, the amplifiers 30a-30n may be closed or open loop amplifiers.

Whether one or more of the amplifiers 30a-30n includes one or two modulation circuits 42a-42n, 46a-46n is based on whether the Hall plate modulation circuit 22 modulates the Hall offset signal component $V_{op}$ or the magnetic signal component $V_H$, since as mentioned above, in the former case, an even number of modulation circuits is required between the output of the Hall plate modulation circuit 22 and the input of the filter stage 34 in order to cancel the offset signal component and in the latter case, an odd number of modulation circuits is required between the output of the Hall plate modulation circuit and the input of the filter stage in order to cancel the offset signal component.

As mentioned above, the anti-aliasing filter 38 removes frequency components as necessary to ensure that the selective filter 40 meets the Nyquist criterion for noise signals. In the illustrative embodiment, in which the selective filter 40 samples at a frequency of 2 $f_{CLK}$, the filter 38 has a cutoff frequency on the order of 0.35 $f_{CLK}$. As will be appreciated by those of ordinary skill in the art, various filter designs are possible for the low pass filter and the particular cutoff frequency of the filter 38 is a function of the sampling frequency of the selective filter 40 and the desired sensor response time.

The selective filter 40 is tuned to a frequency at which incoming signals are eliminated and also attenuates other frequency components above a given bandwidth. In particular, the selective filter 40 is tuned to a frequency selected to ensure removal of the offset signal component with its associated ripple. Thus, the selective filter is tuned to the clock frequency $f_{CLK}$ at which the offset signal component is modulated when it reaches the selective filter.

In the illustrative embodiment, the selective filter 40 is a sampled data filter in the form of a sinc filter having a frequency domain transfer function shaped like a sinc function (see FIG. 7A) and a time domain transfer function shaped like a rectangular function. The selective filter 40 is a discrete time filter in the sense that its zeros in the frequency domain are at exactly the harmonics related to one-half of the sample frequency. In one preferred embodiment, the selective filter samples at a frequency equal to twice the sensor clock frequency $f_{CLK}$. Thus, in this embodiment, the zeros are located at $N(f_{SF}/2)$ or $Nf_{CLK}$, where N is any integer. Thus, the filter 40 removes all the signal components at the clock frequency $f_{CLK}$ and its harmonics and attenuates the other frequency components above a given bandwidth. In this way, the selective filter eliminates the undesired output ripple, whose amplitude is proportional to the DC input offset signal component. Thus, the resulting sensor output signal 36 includes only the magnetic signal component, since the selective filter entirely eliminates the offset signal component with its associated ripple. The extent of attenuation at frequencies other than harmonics of the clock frequency is a function of the number of samples of the input signal taken within one clock period, with greater attenuation achieved by taking more samples. It will be appreciated by those of ordinary skill in the art that the particular selection of the sample frequency requires a tradeoff between greater signal attenuation as is achieved by averaging a larger number of samples (as will provide a higher overall sampling frequency) versus area efficiency achieved by using the minimum number of samples (as will provide a lower overall sampling frequency).

It will be appreciated by those of ordinary skill in the art that while the illustrative selective filter 40 is a sample based sinc filter, alternative filter designs are possible while still achieving the benefits of the illustrative selective filter; namely, of eliminating the offset signal component with its associated ripple. In a preferred embodiment, the selective filter 40 is an averaging filter and may take the form of a continuous time filter, discrete time filter, an analog filter, or a digital filter. As one example, a continuous time comb filter may be used.

The filter stage 34 may include an optional smoothing filter 44 to further attenuate high frequency content (not located at the clock harmonics) in addition to the attenuation already supplied by the selective filter 40. Additionally, since this smoothing filter 44 is only intended for high frequency attenuation (secondary side lobes of the selective filter transfer function), its cutoff frequency does not need to be small. For example, in the illustrative embodiment, the smoothing filter has a cutoff frequency of at least $f_{CLK}$. Thus, the smoothing filter 44 does not introduce any significant delay to the sensor.

Figure 2:
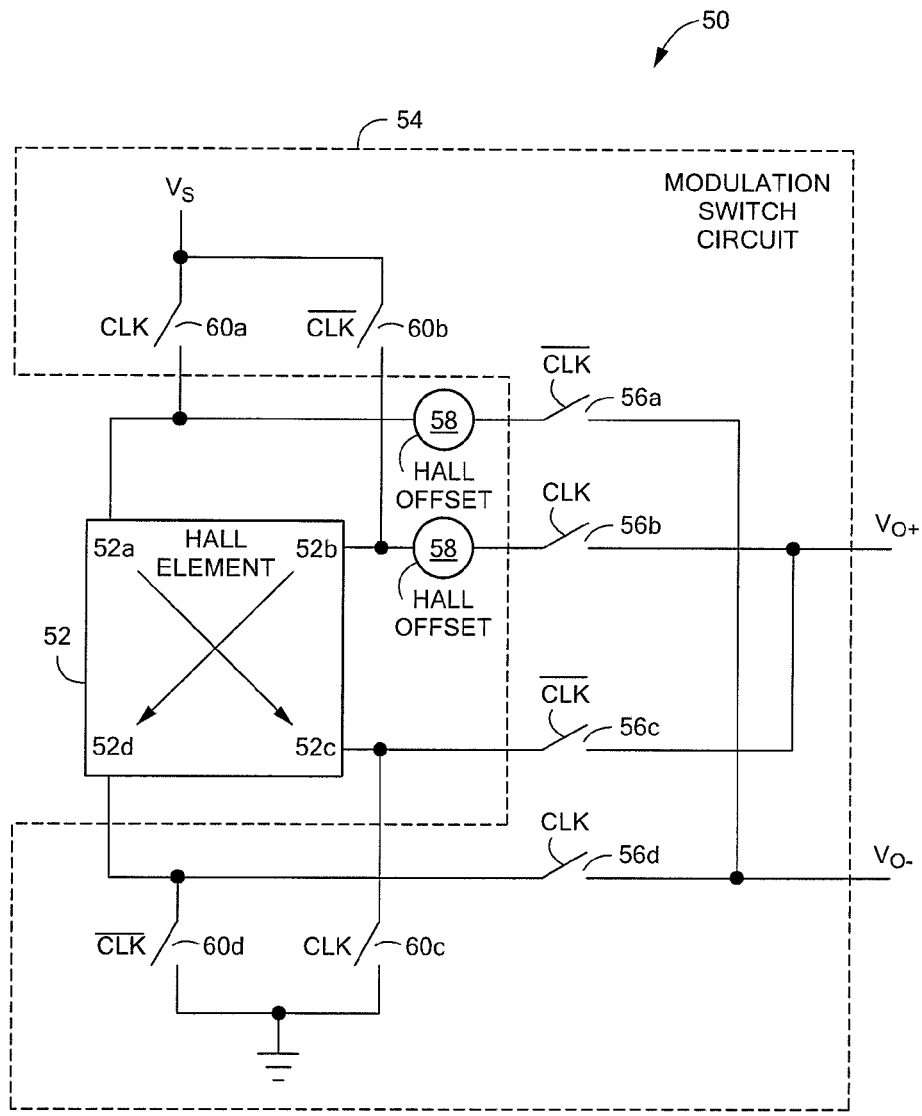
FIG. 2 shows a conventional switched Hall plate for use in the sensor of FIG. 1 to modulate the Hall offset signal component.

Referring also to FIG. 2, a conventional switched Hall plate 50 of the type that modulates the Hall offset signal component is shown to include a Hall element or plate 52 and a Hall plate modulation switch circuit 54. The Hall element 52 includes four equally spaced contacts 52a, 52b, 52c, and 52d, each coupled to a first terminal of a respective switch 56a, 56b, 56c, and 56d, as shown. A second terminal of switches 56b and 56c are coupled to provide the positive node of the switched Hall output signal 16, here labeled Vo+, and the second terminal of switches 56a and 56d are coupled to provide the negative node of the switched Hall output signal 16, here labeled Vo−.

Figure 2A:
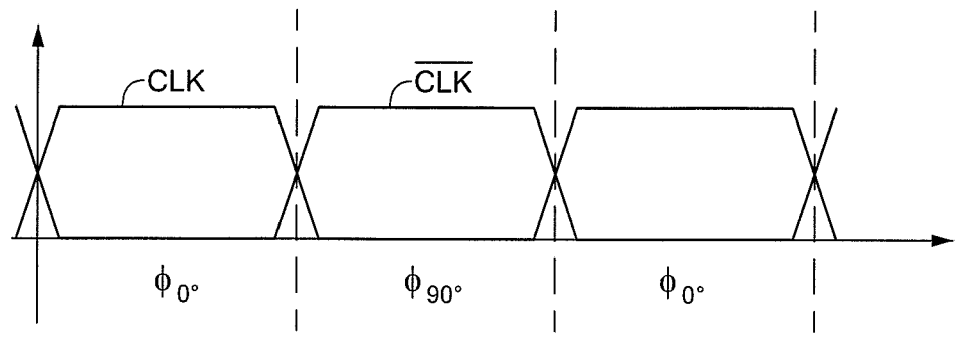
FIG. 2A shows clock signals for switched Hall plate of FIG. 2.

Additional switches 60a, 60b, 60c, and 60d are arranged to selectively couple the Hall contacts 52a, 52b, 52c, 52d to the supply voltage Vs and ground. More particularly, switches 56b, 56d, 60a, and 60c are controlled by a clock signal CLK and switches 56a, 56c, 60b, and 60d are controlled by a complementary clock signal CLK/, as shown. The clock signals CLK and CLK/ have two states, a $\Phi_{0°}$ state and a $\Phi_{90°}$ state, as shown in FIG. 2A.

Figure 2B:
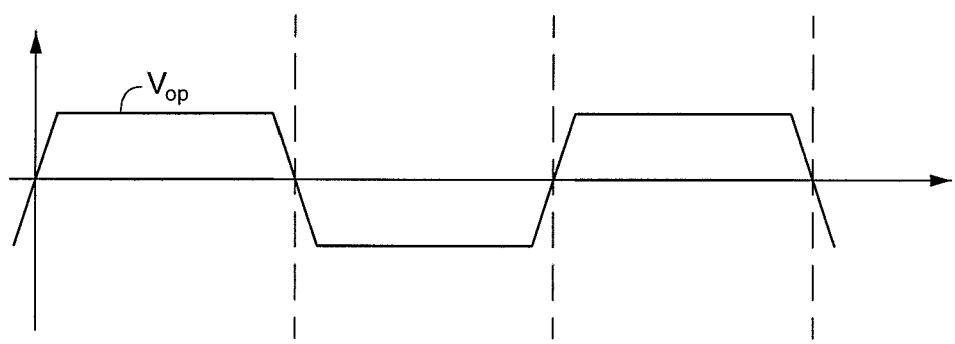
FIG. 2B shows an illustrative modulated Hall offset signal component provided by the switched Hall plate of FIG. 2.
Figure 2C:
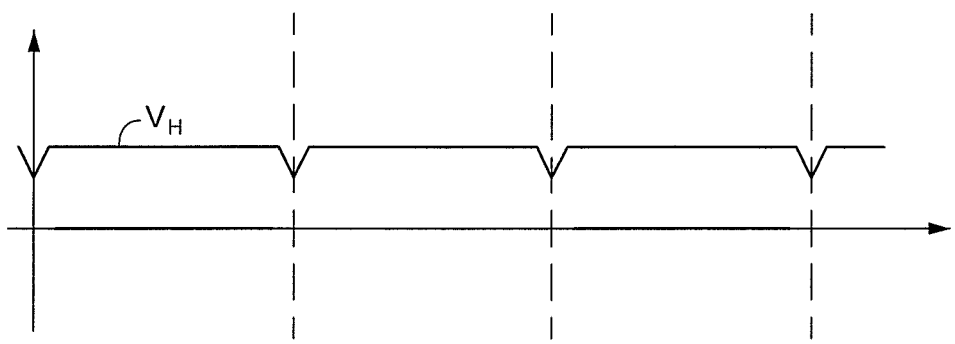
FIG. 2C shows an illustrative magnetic signal component provided by the switched Hall plate of FIG. 2.

In operation, during phase $\Phi_{0°}$, current flows from terminal 52a to 52c and the switched Hall output signal Vo is equal to $V_H+V_{op}$, where $V_{op}$ is the Hall plate offset voltage or Hall offset signal component and $V_H$ is the magnetic signal component. During phase $\Phi_{90°}$, current flows from terminal 52b to 52d and the switched Hall output signal Vo is equal to $V_H-V_{op}$. Thus, the modulation switch circuit 54 modulates the Hall offset signal component $V_{op}$, as shown in FIG. 2B for zero Gauss. The magnetic signal component $V_H$ remains substantially invariant, as shown in FIG. 2C.

Figure 3:
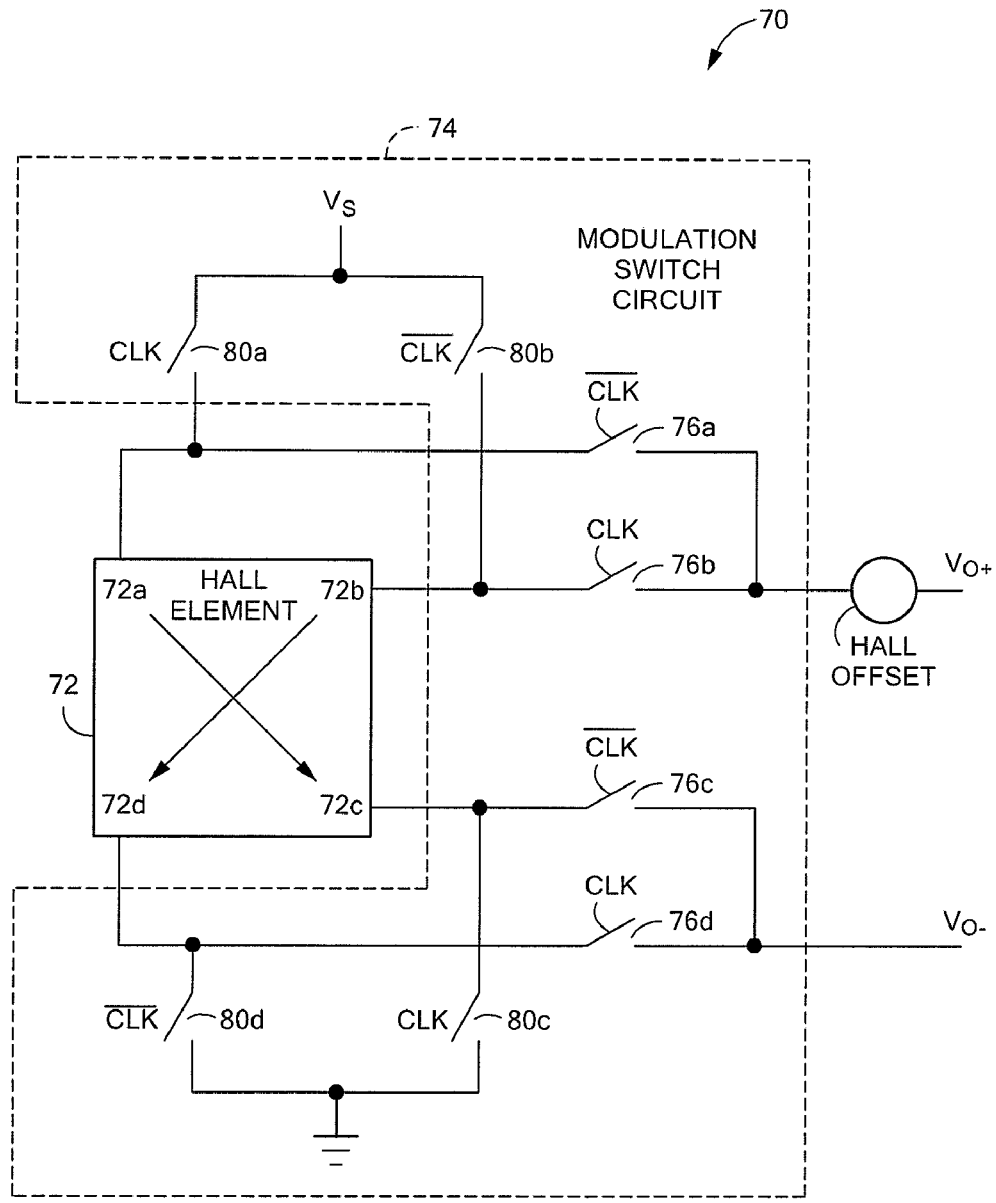
FIG. 3 shows a conventional switched Hall plate for use in the sensor of FIG. 1 to modulate the magnetic signal component.
Figure 3A:
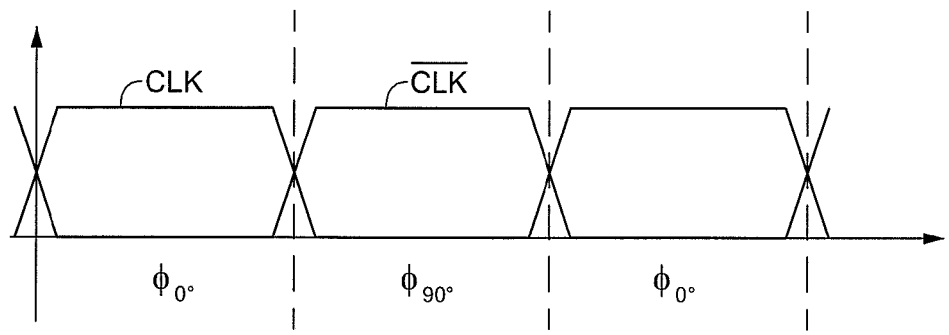
FIG. 3A shows clock signals for the switched Hall plate of FIG. 3.

Referring also to FIG. 3, an alternative conventional switched Hall plate 70 of the type that modulates the magnetic signal component is shown to include a Hall element 72 and a Hall plate modulation switch circuit 74. The Hall element 72 is identical to element 52 of FIG. 2 and includes four contacts 72a, 72b, 72c, and 72d, each coupled to a first terminal of a respective switch 76a, 76b, 76c, and 76d. A second terminal of switches 76a and 76b are coupled to provide the positive node of the switched Hall output signal, here labeled Vo+, and the second terminal of switches 56c and 56d are coupled to provide the negative node of the switched Hall output signal, here labeled Vo−. Thus, a comparison of FIGS. 2 and 3 reveals that the output contacts of the Hall element are interchanged during the $\Phi_{90°}$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal CLK and switches 76a, 76c, 80b, and 80d are controlled by complementary clock signal CLK/, as shown. Clock signals CLK and CLK/ are identical to like signals in FIG. 2 and thus have two states $\Phi_{0°}$ and $\Phi_{90°}$, as shown.

Figure 3B:
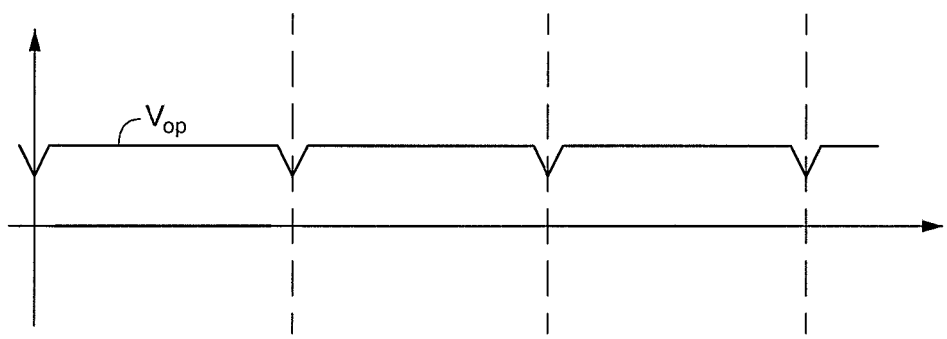
FIG. 3B shows an illustrative Hall offset signal component provided by the switched Hall plate of FIG. 3.
Figure 3C:
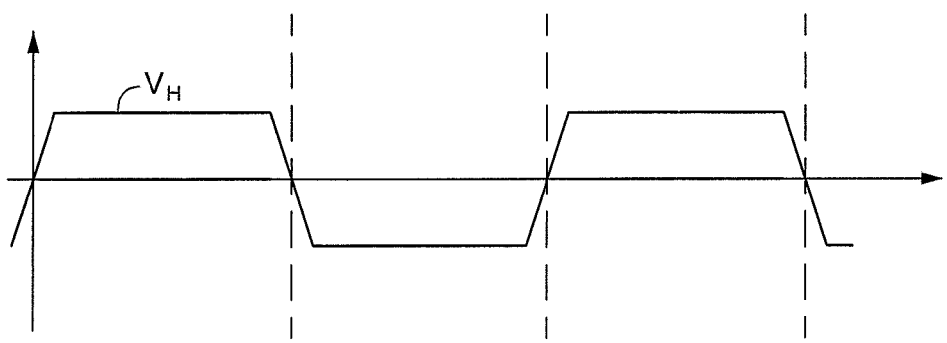
FIG. 3C shows an illustrative modulated magnetic signal component provided by the switched Hall plate of FIG. 3.

In operation, during phase $\Phi_{0°}$, current flows from terminal 72a to 72c and the switched Hall output signal Vo is equal to $V_H+V_{op}$. During phase $\Phi_{90°}$, current flows from terminal 72b to 72d and the switched Hall output signal Vo is equal to $-V_H+V_{op}$. Thus, the modulation switch circuit 54 modulates the magnetic signal component to provide a modulated magnetic signal component $V_H$, as shown in FIG. 3C for zero Gauss. The Hall offset signal component $V_{op}$ remains substantially invariant as is shown in FIG. 3B.

It is noteworthy that in the switched Hall plate 50 of FIG. 2, the Hall offset voltage can be represented as a voltage source 58 between the Hall element 52 and the Hall plate modulation switch circuit 54. Thus, the Hall offset voltage 58 is added to the amplifier offset voltage 48a for example (FIG. 1) after being modulated by the Hall plate modulation circuit 54 (FIG. 2) and demodulated by the modulation circuit 42a (if the same clock frequency $f_{CLK}$ is used for the Hall element and the amplifier). In contrast, in the switched Hall plate 70 of FIG. 3, the Hall offset voltage appears at the output of the switched Hall plate, as shown by voltage source 78. Thus, the Hall offset voltage 78 is indistinguishable from the amplifier offset voltage 48a for example in embodiments not including optional modulation circuit 42a (FIG. 1). Thus, in both cases, the Hall offset voltage and the amplifier offset voltage will be simultaneously processed and cancelled by the sensor 10 of the present invention.

Figure 4A:
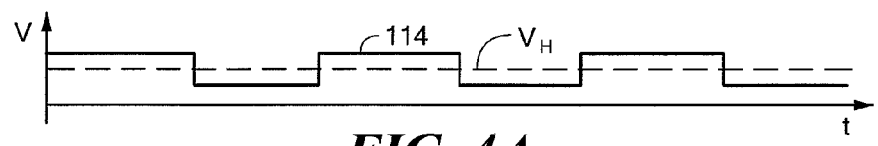
FIG. 4A shows an illustrative Hall output signal with the Hall offset signal component modulated as provided at the output of the switched Hall plate of FIG. 4 and also shows the magnetic signal component of the Hall output signal.

Referring to FIG. 4, a chopped Hall effect sensor 100 according to the invention includes a switched Hall plate 50 of the type shown in FIG. 2 that provides a switched Hall output signal 114 comprising a modulated Hall offset signal component $V_{op}$ and a substantially invariant magnetic signal component $V_H$, as shown in FIG. 4A. Also shown in dotted lines in FIG. 4A is the substantially invariant magnetic signal component of the signal 114. The sensor 100 further includes a chopped amplifier 110 having an input coupled to the output of the switched Hall plate 50 and an output at which an amplified signal 116 is provided. A filter stage 120, like filter stage 34 of FIG. 1, has an input coupled to the output of the amplifier stage 110 and an output at which the sensor output signal 118 is provided. The filter stage 120 is shown without the optional smoothing filter (labeled 44 in FIG. 1).

The amplifier 110 is a closed loop amplifier having a feedback network 124, as shown. One illustrative embodiment of the feedback network 124 is shown and described in connection with FIG. 6. Use of a closed loop amplifier is desirable due to the resulting high linearity and gain stability over frequency, temperature, process and power supply levels. Furthermore, because the magnetic signal component $V_H$ (FIG. 4A) is at baseband, the tighter bandwidth required of the closed loop amplifier 110 does not adversely impact recovery of the magnetic signal component. An additional advantage to the closed loop amplifier 110 in the embodiment of FIG. 4 is the ability to provide a higher gain amplifier while maintaining the same gain bandwidth product, therefore reducing the closed loop bandwidth as much as might be necessary to achieve stability.

Depending on the type of feedback network used, significant area savings may be achieved in the filter stage 34. For example, if a Miller compensation scheme is used, where the "reflected" capacitance sets the cutoff frequency, and the bandwidth is able to be set to achieve both loop stability and to allow the selective filter 150 to meet the Nyquist criteria, then the low pass filter 144 can perform the functionality of both the Miller stage and the anti-aliasing filter. Alternatively, if the bandwidth cannot be set to meet both the stability and anti-aliasing requirements, regardless of whether the compensation scheme includes a Miller stage, then a separate anti-aliasing filter must be provided and the feedback loop can be closed before the anti-aliasing filter.

Figure 4B:
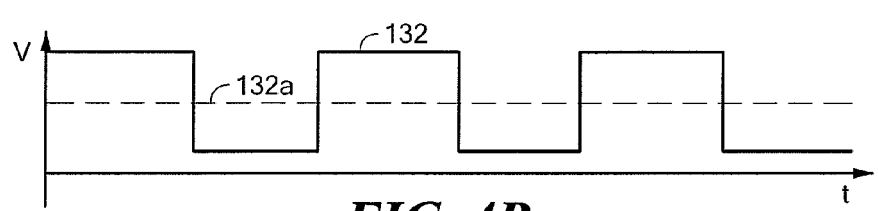
FIG. 4B shows the signal provided at the input to the gain stage of FIG. 4 having the offset signal component demodulated and the magnetic signal component modulated and also shows the demodulated offset signal component.

The switched Hall output signal 114 is coupled to an input of a summing node 126 and the feedback network 124 is also coupled to an input of the summing node 126, as shown. The summing node 126, like others described herein, may be a current or a voltage summing node. The output of the summing node 126 is coupled to a first modulation circuit, here shown in the form of a pair of cross-coupled switches 130 that modulate the incoming signal at the clock frequency $f_{CLK}$. The output signal 132 of modulation circuit 130 thus contains a modulated magnetic signal component and a demodulated offset signal component, as shown in FIG. 4B, Also shown in dotted lines in FIG. 4B is the demodulated offset signal component 132a. Note that the offset signal component of the signal 132 includes the Hall offset signal component $V_{op}$ (as represented by voltage source 58 in FIG. 2) and the amplifier offset signal component $V_{oa}$ (as represented by voltage source 134 in FIG. 4).

In order to obtain a fast sensor step response time, the clock frequency $f_{CLK}$ is selected such that the clock period is in the order of one-half (or less) of the desired step response time (SRT). In one illustrative embodiment in which the desired step response time is on the order of 2.0 μs, the clock frequency is on the order of 1 MHz.

Gain stage 138 provides an amplified signal to a further modulation circuit, here shown in the form of a pair of cross-coupled switches 140, as shown. The gain stage 138 must have a bandwidth large enough to pass the modulated magnetic signal component. In one illustrative embodiment, the gain stage bandwidth is at least five times the clock frequency $f_{CLK}$. Thus, the tighter bandwidth required to implement the amplifier 110 in a closed loop form must be balanced with the minimum bandwidth necessary to pass the desired magnetic signal component. Since the modulated magnetic signal component does not go through the filter 144 or the Miller feedback stage 124, the closed loop bandwidth does not affect the modulated signal bandwidth. Only the amplifier's section through which the modulated magnetic signal component passes needs to have enough bandwidth to pass the desired magnetic signal component.

Figure 4C:
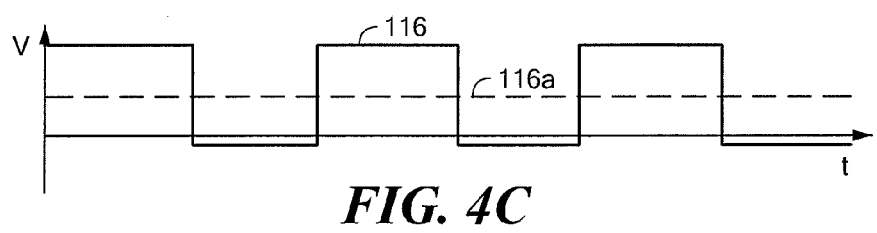
FIG. 4C shows the signal provided at the input to the filter stage of FIG. 4 having the offset signal component modulated and the magnetic signal component demodulated and also shows the demodulated magnetic signal component.

Modulation circuit 140 operates at the clock frequency $f_{CLK}$ to provide the amplified signal 116 containing a demodulated magnetic signal component and a modulated offset signal component, as shown in FIG. 4C. Also shown in dotted lines in FIG. 4C is the demodulated magnetic signal component 116a. Note again that the offset being modulated by the modulation circuit 140 includes the Hall offset and the amplifier offset which are added at the output of the first modulation circuit 130.

The amplified signal 116 is coupled to the filter stage 120 and more particularly, to the anti-aliasing, low pass filter 144, as shown. Recall that the purpose of the filter 144 is to perform an anti-aliasing function by removing frequency components that would fold-back to the baseband. In the illustrative embodiment, the selective filter 150 samples at a frequency equal to twice the clock frequency $f_{CLK}$. Thus, in order to perform its anti-aliasing function, the cutoff frequency of the filter 144 must be limited to a maximum of the clock frequency $f_{CLK}$ and in one illustrative embodiment is on the order of 0.35 $f_{CLK}$.

Figure 4D:
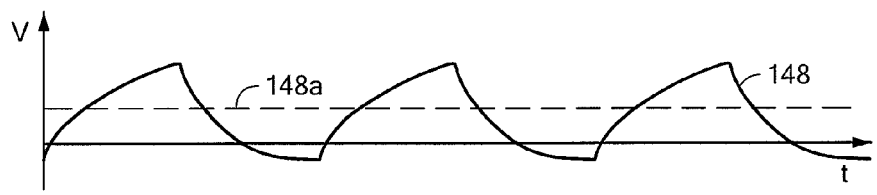
FIG. 4D shows the filtered signal provided at the output of the anti-aliasing filter of FIG. 4 and the demodulated magnetic signal component.

The low pass filter 144 provides the filtered signal 148 of FIG. 4D that includes a partially attenuated modulated offset signal component and a demodulated magnetic signal component. Thus, the signal 148 contains successive alternating polarity exponential responses which is the chopped amplifier's residual ripple. The degree of attenuation of the ripple depends directly on the cutoff frequency of the filter 144. Also shown in dotted lines in FIG. 4D is the demodulated magnetic signal component 148a.

In order to obtain a fast response time, the time constant τ of the filter 144 must be such that the rise time does not exceed one-half of the desired step response time (SRT). Assuming that the rise time equals about 2.2 τ (as is typical for first order systems), and that the clock period is one-half the desired response time, then the cutoff frequency of the filter 144 is selected to be on the order of 0.35 $f_{CLK}$. More particularly, $T_{CLK}=\frac{1}{2}*SRT=\frac{1}{2}*(2*rise\ time)=2.2\tau$. Since $f_{cutoff}=1/(2*\pi*\tau)$, we get $1/(2*\pi*(T_{CLK}/2.2))$ or $f_{cutoff}=0.35\ f_{CLK}$. With such a cutoff frequency, the filter 144 will not totally attenuate the ripple since the ripple contains harmonics of $f_{CLK}$. However, the selective filter 150 does completely eliminate the ripple as will become apparent.

Figure 4E:
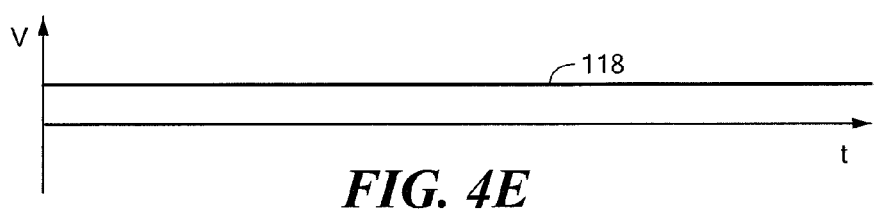
FIG. 4E shows the signal provided at the output of the selective filter of FIG. 4.

The selective filter 150 is a discrete time filter having zeros located at $N(f_{SF}/2)$, where N is any integer and $f_{SF}$ is the sampling frequency. In one illustrative embodiment shown and described below in conjunction with FIG. 7, the selective filter 150 is a time domain averaging filter with which the input signal 148 is averaged at the rate $f_{CLK}$ and the sampling frequency $f_{SF}$ is selected to be equal to two times the clock frequency $f_{CLK}$. The resulting sensor output signal 118 is shown in FIG. 4E to include only the magnetic signal component (identical to magnetic signal component 148a as provided at the output of the filter 144), since the selective filter entirely eliminates the offset signal component 148 with its associated ripple.

As is apparent from consideration of FIG. 4, this embodiment contains an even number of modulation circuits between the output of the Hall plate modulation circuit 50 that modulates the Hall offset signal component and the input to the filter stage 120. Specifically, the modulation circuit output signal 114 is processed by two modulation circuits 130 and 140, before reaching the low pass filter 144. Modulation circuit 130 demodulates the offset signal component to baseband and modulation circuit 140 then up-converts the offset signal component so that the selective filter 150 can remove the offset and its associated ripple to thereby recover the desired magnetic signal component.

Figure 5A:
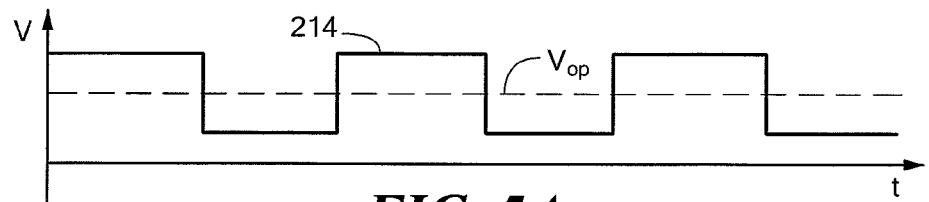
FIG. 5A shows an illustrative Hall output signal with the magnetic signal component modulated as provided at the output of the switched Hall plate of FIG. 5 and also shows the offset signal component of the Hall output signal.

Referring to FIG. 5, an alternative Hall effect sensor 200 according to the present invention includes a switched Hall plate 70 of the type shown in FIG. 3 that provides a switched Hall plate output signal 214 comprising a substantially invariant Hall offset signal component $V_{op}$ and a modulated magnetic signal component $V_H$, as shown in FIG. 5A. Also shown in dotted lines in FIG. 5A is the substantially invariant Hall offset signal component $V_{op}$. The sensor 200 further includes a chopped amplifier 210 having an input coupled to the output of the switched Hall plate 70 and an output at which an amplified signal 216 is provided. A filter stage 220 has an input coupled to the output of the amplifier stage 210 and an output at which the sensor output signal 218 is provided. Here again, the optional smoothing filter is not shown.

Figure 6:
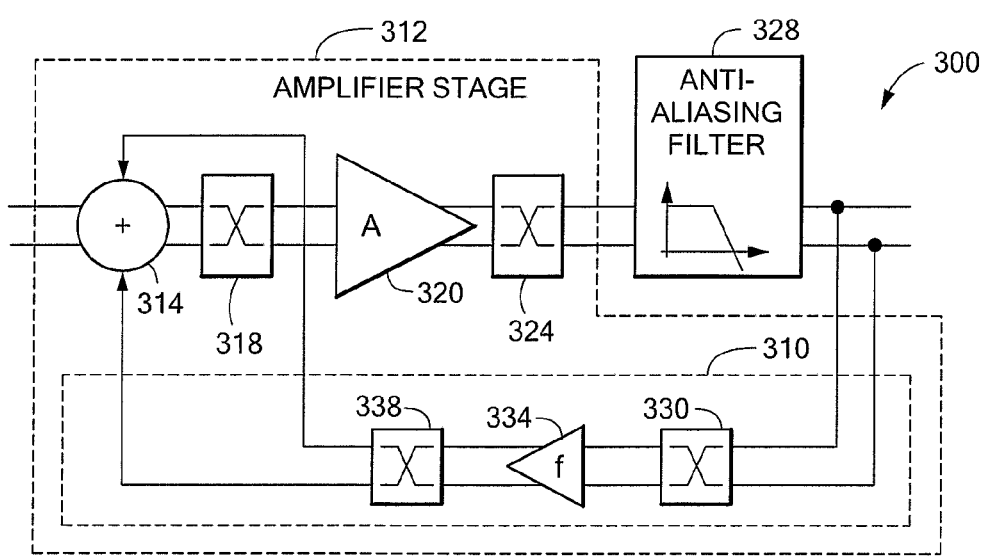
FIG. 6 shows an illustrative feedback network embodiment for the amplifiers of FIGS. 1, 4, and 5.

As in the embodiment of FIG. 4, the amplifier 210 is a closed loop amplifier having a feedback network 224, as shown. The illustrative feedback network shown in FIG. 6 is suitable to provide the feedback network 224 in the embodiment of FIG. 5. It will be appreciated by those of ordinary skill in the art, that the same advantages described above in connection with the closed loop amplifier 110 of FIG. 4 are realized in the sensor of FIG. 5 (e.g., high linearity, gain stability, higher gain and area savings).

As with the embodiment of FIG. 4, since the magnetic signal component at the input to gain stage 238 is modulated, the tighter bandwidth required to implement the amplifier 210 in a closed loop form must be balanced with the minimum bandwidth necessary to pass the desired magnetic signal component. Since the modulated magnetic signal component does not go through the filter 244 or the Miller feedback stage 224, the closed loop bandwidth does not affect the modulated signal bandwidth. Only the amplifier section through which the modulated magnetic signal component passes needs to have enough bandwidth to pass the desired magnetic signal component.

A summing node 226 has inputs coupled to the feedback network 224 and an output coupled to a first modulation circuit, shown here in the form of a pair of cross-coupled switches 230 that modulate the incoming signal at the clock frequency $f_{CLK}$. The output signal of modulation circuit 230 is coupled to an input of the gain stage 238. The switched Hall output signal 214 is also coupled to the input of the gain stage 238, as shown. Thus, in this embodiment, the switched Hall output signal 214 is not processed by the modulation circuit 230. Also shown at the input to the gain stage 238 is a voltage source 234 representing the amplifier offset signal component $V_{oa}$.

Gain stage 238 provides an amplified signal to a further modulation circuit, here in the form of a pair of cross-coupled switches 240, as shown. As noted, the gain stage 238 must have a bandwidth large enough to pass the magnetic signal component that has been modulated by the switched Hall plate 70. In one illustrative embodiment, the gain stage bandwidth is at least five times the clock frequency $f_{CLK}$.

Figure 5B:
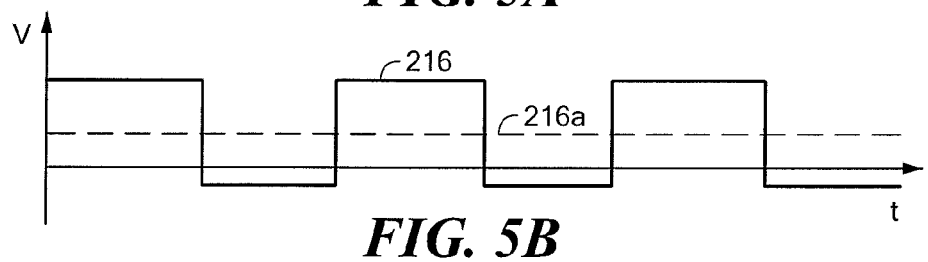
FIG. 5B shows the signal provided at the input to the filter stage of FIG. 5 having the offset signal component modulated and the magnetic signal component demodulated and also shows the demodulated magnetic signal component.

Modulation circuit 240 operates at the clock frequency $f_{CLK}$ to provide the amplified signal 216 having a demodulated magnetic signal component and a modulated offset signal component, as shown in FIG. 5B. Also shown in dotted lines in FIG. 5B is the demodulated magnetic signal component 216a. Note again that the offset being modulated by the second modulation circuit 240 includes the Hall offset signal component $V_{op}$ (as represented by voltage source 78 in FIG. 3) and the amplifier offset signal component $V_{oa}$ (as represented by voltage source 234 in FIG. 5), which offsets are added at the input to the gain stage 238.

Figure 5C:
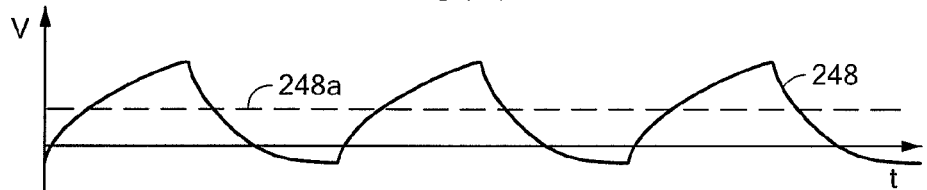
FIG. 5C shows the signal provided at the output of the anti-aliasing filter of FIG. 5 and the demodulated magnetic signal component.

For reasons described above in connection with FIG. 4, the cutoff frequency of the filter 244 is selected to be on the order of 0.35 $f_{CLK}$. With such a cutoff frequency, the filter 244 will not totally attenuate the ripple caused by the offset signal component since the ripple contains harmonics of $f_{CLK}$. However, the selective filter 250 does completely eliminate the ripple. The output signal 248 of the low pass filter 244 is shown in FIG. 5C. Also shown in dotted lines in FIG. 5C, is the demodulated magnetic signal component 248a of the signal 248.

Figure 5D:
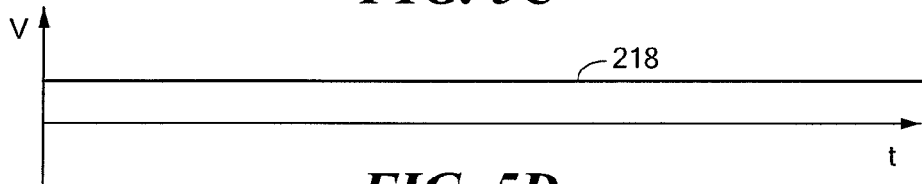
FIG. 5D shows the signal provided at the output of the selective filter of FIG. 5.

Here, the sampling frequency $f_{SF}$ of the selective filter 250 is selected to be equal to two times the clock frequency $f_{CLK}$, resulting in the filter zeros being located at $f_{CLK}$ and its harmonics. Thus, since the selective filter 250 removes frequency components at $f_{CLK}$ and its harmonics, the undesired output ripple, that has an amplitude proportional to the DC offset signal component, and thus the offset signal component itself is eliminated. The resulting sensor output signal 218 is shown in FIG. 5D to include only the magnetic signal component (identical to magnetic signal component 248a as provided at the output of the filter 244), since the selective filter entirely eliminates the offset signal component.

As in the embodiment of FIG. 4, the selective filter 250 is a time domain averaging filter with which the input signal 248 is averaged at the rate $f_{CLK}$. An illustrative embodiment for the selective filter 250 is described and shown in connection with FIG. 7.

As is apparent from consideration of FIG. 5, this embodiment contains an odd number of modulation circuits between the output of the Hall plate modulation circuit 70 that modulates the magnetic signal component and the input to the filter stage 220. Specifically, the modulation circuit output signal 214 is processed by one modulation circuit 240, before reaching the low pass filter 244. Modulation circuit 240 up-converts the offset signal component so that the selective filter 250 can remove the offset and its associated ripple to thereby recover the desired magnetic signal component.

The modulation circuit 230 is shown in dotted lines to illustrate that its position may be varied. More particularly, the modulation circuit 230 may be positioned as shown in FIG. 5, between the summing node 226 and the gain stage 238. Alternatively, the modulation circuit 230 may be provided as part of the feedback network 224. In either position, the modulation circuit 230 modulates the feedback signal prior to its being added to the modulated magnetic signal component at the input to the gain stage 238.

Referring to FIG. 6, a portion of a Hall effect sensor 300 similar to Hall effect sensor 200 of FIG. 4 is shown to include an illustrative feedback network 310 of the type suitable to provide the feedback network 124 of FIG. 4 or the feedback network 224 of FIG. 5. The sensor portion 300 includes an amplifier 312, similar to amplifier 210 of FIG. 4 and thus, including a summing node 314, a first modulation circuit, here shown in the form of a pair of cross-coupled switches 318, a gain stage 320, and a second modulation circuit, here shown in the form of a pair of cross-coupled switches 324, all arranged and operable as described in connection with similar respective elements 126, 130, 138, and 140 of FIG. 4. The sensor portion 300 further includes an anti-aliasing low pass filter 328 arranged and operable as described in connection with similar filter 144 of FIG. 4.

The feedback network 310, like the feedback network 124 of FIG. 4, has an input coupled to the output of the filter 328 and provides a feedback signal to an input of summing node 314. In some embodiments, it is desirable to provide the feedback network 310 with the capability of adjusting the gain of the amplifier 312. This feature is particularly advantageous in applications which provide sensitivity/gain trimming, for example in applications where airgaps need to be calibrated and adjusted to a certain range. To this end, preferably, the feedback network 310 includes an active amplifier, such as a transconductance amplifier whose output current can be adjusted to a desired level. As one example, the feedback network 310 may include a Gilbert cell which is a current multiplier that can be used to adjust the gain of the feedback amplifier 334 and thus, the overall closed loop gain. It will be appreciated by those of ordinary skill in the art that other feedback networks can be used to provide gain adjustment capabilities for the feedback amplifier, such as by changing a resistor, a voltage or a current, thereby allowing the overall gain of the Hall effect sensor to be adjusted or programmed.

More particularly, the feedback network 310 includes a first modulation circuit, shown here in the form of a pair of cross-coupled switches 330 having an input coupled to the output of filter 328 and an output coupled to a feedback gain stage 334. The output of the gain stage 334 is coupled to an input of a further modulation circuit, also shown here in the form of a pair of cross-coupled switches 338, which switches provide at an output the feedback signal for coupling to the summing node 314, as shown. The modulation circuits 330, 338 modulate the respective input signal at the clock frequency $f_{CLK}$.

Given the active elements of the Gilbert cell network 310, it may be desirable to eliminate the offset contribution from this network. To this end, the feedback amplifier 334 may be chopped, as provided in the embodiment of FIG. 6 with modulation circuits 330 and 338. With this arrangement, the modulated offset coming from the feedback amplifier 334 goes around the loop and also through the filter 328, so that this offset is treated in the same way as both the offset signal component from the Hall plate and the offset signal component from the forward amplifier 320.

It will be appreciated by those of ordinary skill in the art that the feedback network 310 of FIG. 6 is one of various ways to implement the feedback network. As one example, a resistive feedback network could be used.

Figure 7:
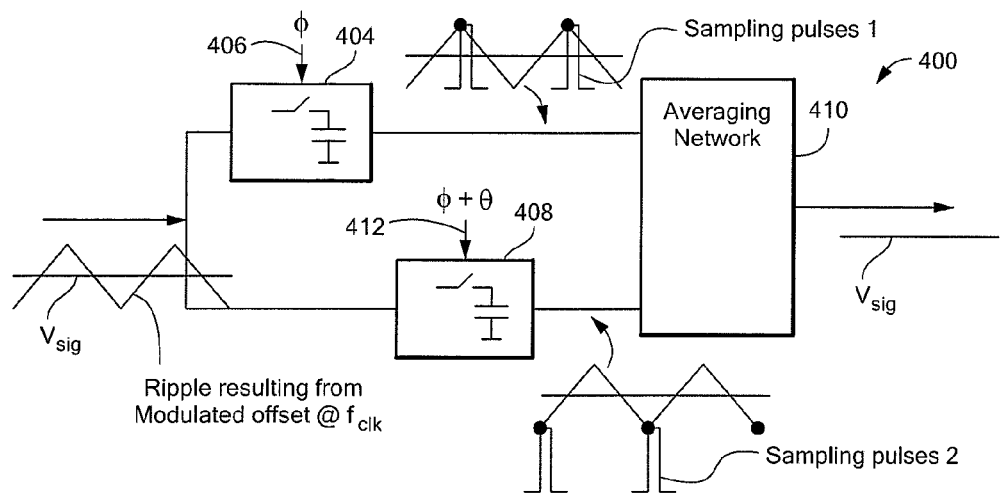
FIG. 7 shows an illustrative embodiment for the selective filter of FIGS. 1, 4, and 5.

Referring to FIG. 7, an illustrative selective filter 400 of the type suitable for use as the selective filter 40 of FIG. 1, the selective filter 150 of FIG. 4, or the selective filter 250 of FIG. 5 includes a first sample and hold circuit 404 and a second sample and hold circuit 408, each having an input responsive to an anti-alias filtered signal, like signal 148 of FIG. 4 or signal 248 of FIG. 5. Each sample and hold circuit 404, 408 has an output coupled to an averaging network 410, as shown. The output signal 412 of the averaging network 400 provides the output of the selective filter 400.

Figure 7A:
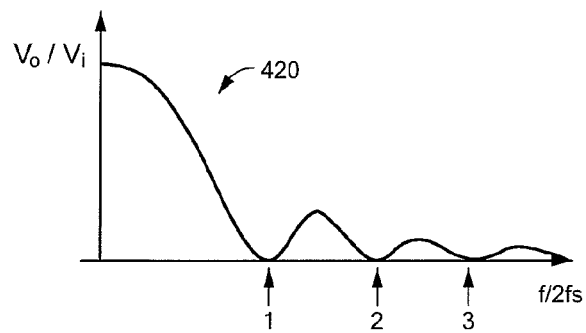
FIG. 7A shows the transfer function of the selective filter of FIG. 7.

Referring also to FIG. 7A, in the frequency domain, the transfer function 420 of the filter 400 is shaped like a sinc function, while in the time domain is shaped like a rectangular function. The filter 400 removes frequency components at $N(f_{SF}/2)$, where N is any integer and $f_{SF}$ is the sampling frequency and attenuates higher frequency components. In the illustrative embodiment in which the sampling frequency $f_{SF}$ is equal to twice the clock frequency $f_{CLK}$, the filter removes components at $f_{CLK}$ and its harmonics.

It is important to note that the selective filter 400 provides a negligible attenuation from DC up to approximately $f_{SF}/8$, with the attenuation increasing gradually from that frequency up to $f_{SF}/2$. Ideally, at a frequency of $f_{SF}/2$, the attenuation is infinite (i.e., zero in the frequency domain), as shown in FIG. 7A. However, this does not pose a constraint on the system, assuming that the bandwidth for the magnetic signal component being processed is much smaller than $f_{SF}$. While an input step signal, which might represent a fault condition in, for example, a battery current sensor application, would not have such a bandwidth much smaller than $f_{SF}$, this too is not problematic since, in this scenario, the system is not focused on providing an exact replica of the input waveform but rather is focused on reacting fast enough in order to eventually trigger a comparator controlling the battery supply connections.

Figure 7B:
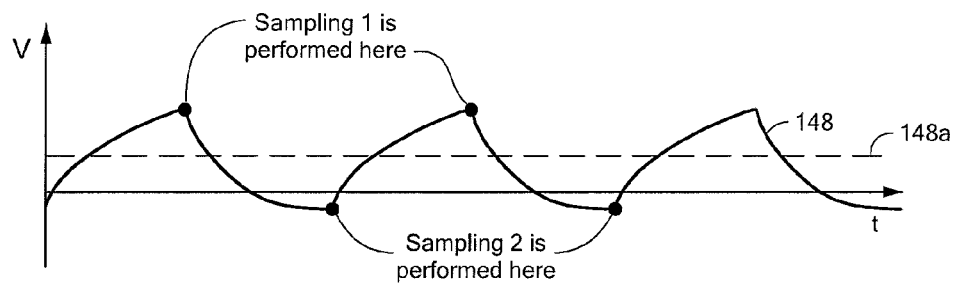
FIG. 7B shows the signals of FIG. 4D with notations to illustrate operation of the selective filter of FIG. 7.

Referring also to FIG. 7B signals 148 and 148a of FIG. 4D are shown with notations to illustrate operation of the selective filter 400. In operation, the first sample and hold circuit 404 samples the input signal in response to a sample clock signal 406 having a frequency equal to the modulation frequency $f_{CLK}$ and a phase Φ, whereas the second sample and hold circuit 408 samples the input signal in response to a sample clock signal 412 at the same frequency $f_{CLK}$, but at a phase Φ+θ, where θ is equal to 180°. Described another way, the first sample and hold circuit 404 samples the input signal at times $t=t0+N*T_{SF}=t0+(N/2)*T_{CLK}$; whereas the second sample and hold circuit 408 samples the input signal at times $t=t0+(N+1)*T_{SF}=t0+((N+1)/2)*T_{CLK}$, where t0 is an arbitrary time and N is an integer. Short pulses are used to perform the sampling operation. The duration of the pulses is set large enough to allow the signal to reach its final value before holding, as is a function of the RC time constant associated with the resistance of the sample and hold switches and the capacitance of the capacitor. In one illustrative embodiment, the pulse width is on the order of 200 ns.

For simplicity of illustration, the sample and hold circuit 404 is shown in FIG. 7B to sample the input signal at the peaks of the signal 148 and the sample and hold circuit 408 samples the input signal at the valleys of the signal. Since the peaks of the input signal 148 correspond to transitions of the modulation clock signal, in the illustrated example, the sample clock signals coincide with transitions of the modulation clock signal. However, it will be appreciated that the phase shift between the sample clock signals and the modulation clock signal can be arbitrary. In fact, it may be desirable to sample the input signal closer to the zero crossing of the ripple in order to avoid large signal excursions.

This synchronized sampling of the input signal at twice the ripple frequency allows averaging the ripple signal, thereby completely removing it. Furthermore, the ripple average value is obtained after just one modulation clock period $1/f_{CLK}$ and thus, this is the only delay the selective filter introduces.

According to the selective filter operation described thus far, in which the input signal is averaged at the modulation frequency rate of $f_{CLK}$, several samples are accumulated, averaged, and then discarded in order to accumulate and average new samples to provide the next averaged signal value. This type of filter operation may be referred to as an "accumulation and dump" operation and may be described in the context of the illustrative circuit as the selective filter output signal comprising a plurality of signal averages, with each signal average being based on samples of the anti-aliasing filter output signal taken within a single modulation clock cycle.

It will be appreciated by those of ordinary skill in the art however that, alternatively, a running average may be used in which N samples are stored and averaged to provide a first averaged signal value and when a new sample is taken (i.e., sample N+1), the oldest previously stored sample (i.e., sample 1) is dropped and a new averaging is performed based on the previously stored samples (i.e., samples 2, 3, ... N) and the new sample (i.e., sample N+1). In this case, the input signal is averaged at the sampling rate $f_{SF}$. In the context of the illustrative circuit, this type of running average operation may be described as the selective filter output signal comprising a plurality of signal averages, with each signal average being based on a plurality of samples of the anti-aliasing filter output signal used to provide a previous signal average and a new sample of the anti-aliasing filter output signal.

Advantageously, the selective filter 400 has the property of tracking any change on the clock frequency, for example as may be due to temperature or process variations. This is because the sampling frequency $f_{SF}$ is selected to be twice the clock signal frequency $f_{CLK}$ and is in fact generated from the clock signal. With this arrangement, precise synchronization of the filter 400 to the ripple frequency $f_{CLK}$ is achieved, thereby ensuring accurate cancellation of the offset ripple.

As noted above in connection with FIG. 1, in addition to removing all the signal components at the clock frequency $f_{CLK}$ and its harmonics, the filter also attenuates the other frequency components above a given bandwidth. The extent of attenuation at frequencies other than harmonics of the clock frequency is a function of the number of samples of the input signal taken within one clock period, with greater attenuation in the filter sidelobes being achieved by taking more samples. The particular selection of the sample frequency requires a tradeoff between greater signal attenuation as is achieved with by taking more samples (i.e., a higher overall sampling frequency) versus area efficiency achieved by taking fewer samples (i.e., a lower overall sampling frequency). It will be appreciated by those of ordinary skill in the art that the illustrative embodiment in which the sample frequency $f_{SF}$ is twice the clock frequency $f_{CLK}$ represents the minimum sample frequency possible to achieve the selective filter averaging operation.

More generally, the selective filter may be designed to take N pairs of samples of the input signal during each clock cycle, again where 1 is the minimum value of N. Samples are taken in pairs (i.e., an even number of samples are taken during each clock cycle) in order to average out the ripple during each clock cycle, which ripple is symmetrical around the magnetic signal component. With this arrangement, the sampling frequency $f_{SF}$ is a multiple of the modulation frequency $f_{CLK}$. For proper selective filter operation, the clock signals controlling a given pair of samples are separated in phase by 180 degrees and the clock signals controlling different pairs of samples are arbitrarily separated in phase.

Thus, the more general filter may be described as including a plurality of sample and hold circuits arranged in pairs, each having an input coupled to the output of the anti-aliasing filter and an output. Specifically, the filter includes N pairs of sample and hold circuits, or 2N sample and hold circuits. The filter further includes an averaging circuit having a plurality of inputs, each coupled to the output of a respective sample and hold circuit, and an output at which the selective filter output signal is provided. Each of the 2N sample and hold circuits samples the low-pass filtered signal at the modulation frequency $f_{CLK}$ (so that the signal is sampled during each clock cycle at a multiple of the modulation frequency) and at a phase separated from the phase of the other sample and hold circuit of the same pair by 180 degrees and a phase arbitrarily separated from the phase of the other sample and hold circuit pairs.

Figure 8:
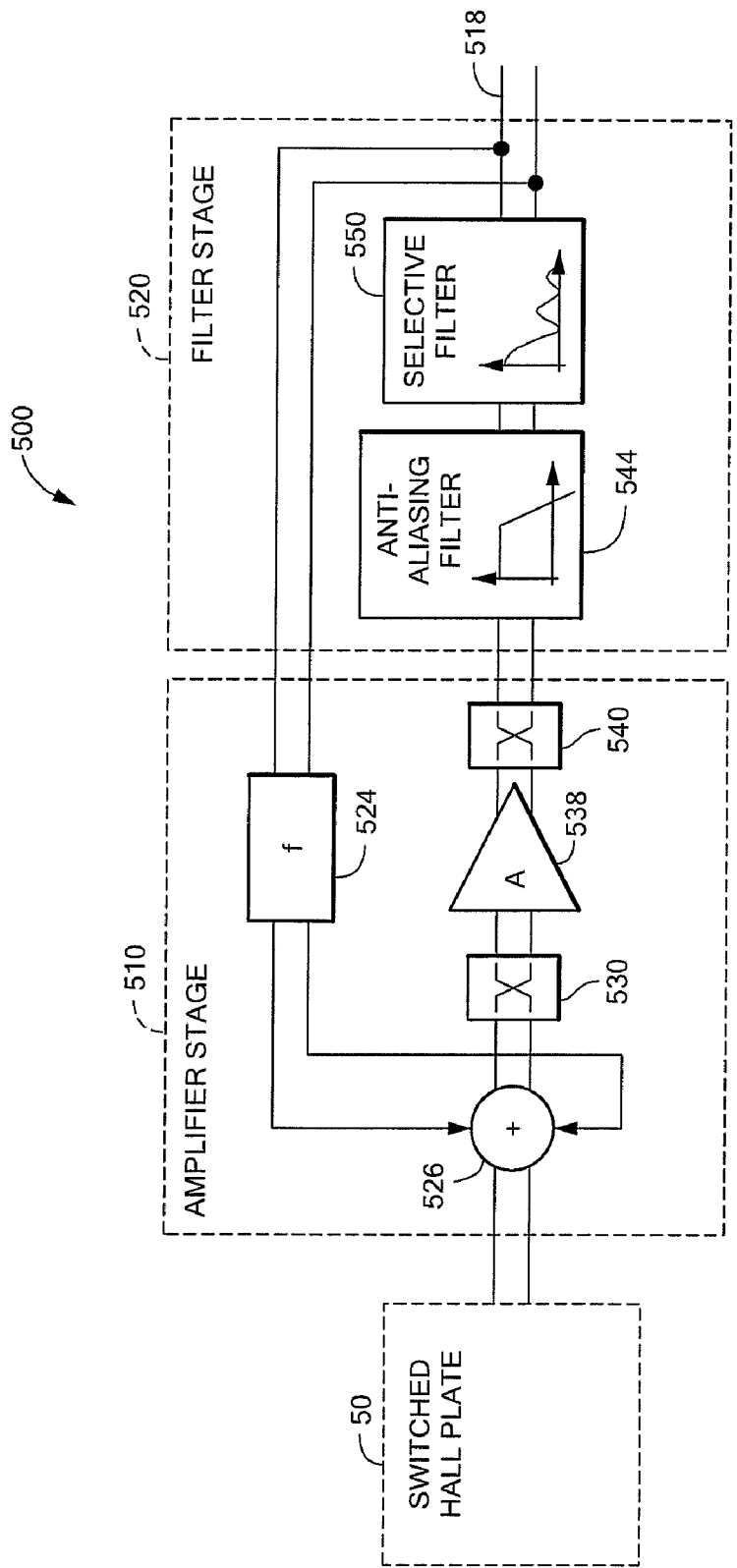
FIG. 8 is a block diagram of a farther alternative chopped Hall effect sensor according to the invention in which the switched Hall plate modulates the Hall offset signal component.

Referring to FIG. 8, a further alternative chopped Hall effect sensor 500 according to the invention includes switched Hall plate 50 of the type described in FIG. 3 that modulates the offset signal component. The sensor 500 further includes a chopped amplifier 510 having an input coupled to the output of the switched Hall plate 50 and an output at which an amplified signal 516 is provided. A filter stage 520 has an input coupled to the output of the amplifier stage 510 and an output at which the sensor output signal 518 is provided. Again, the optional smoothing filter is not shown.

The amplifier 510 is substantially identical to the amplifier 110 of FIG. 4 and thus includes a summing node 526, a first modulation circuit, shown here in the form of a pair of cross-coupled switches 530, a gain stage 538, and a second modulation circuit also shown here in the form of a pair of cross-coupled switches 540, all arranged and operable in the same manner as like respective components 126, 130, 138, and 140 in FIG. 4. The filter stage 520 is substantially identical to the filter stage 120 of FIG. 4 and thus, includes an anti-aliasing filter 544 and a selective filter 550 (which may be of the type shown in FIG. 7), arranged and operable in the same manner as like respective components 144 and 150 in FIG. 4.

As in the embodiment of FIG. 4, the amplifier 510 is a closed loop amplifier having a feedback network 524, as shown. The illustrative feedback network 310 shown in FIG. 6 is suitable for use to provide the feedback network 524 in the embodiment of FIG. 8.

The sensor 500 of FIG. 8 differs from the sensor 100 of FIG. 4 in that, in FIG. 8, the amplifier loop is closed around the selective filter 550. Thus, the feedback network 524 has an input coupled to the output of the selective filter 550 and an output coupled to the summing node 526, as shown.

This arrangement is advantageous in embodiments in which the poles associated with the amplifier loop are located so as to prevent the zeros introduced by the selective filter 550 from adversely impacting the loop stability. In other words, with the selective filter 550 positioned within the amplifier loop as shown in FIG. 8, the zeros introduced by the selective filter (as will be located at harmonics of the sample frequency) will contribute to the loop stability. Again, depending on the location of the poles, this might not be problematic. And positioning the selective filter 550 within the amplifier loop provides the benefit of minimizing the impact of the any offset associated with the selective filter on the overall system offset. This is because, with the selective filter positioned as shown in FIG. 8, its offset contribution is divided by the open loop gain, which is typically on the order of 60 to 100 dB, thereby making its contribution to the overall system offset performance negligible. By contrast, in the embodiments of FIGS. 4 and 5, in which the respective selective filter is located outside of the amplifier loop, any offset associated with the selective filter may impact the overall offset performance, particularly, if the chopped amplifier gain is not large by comparison.

Figure 9:
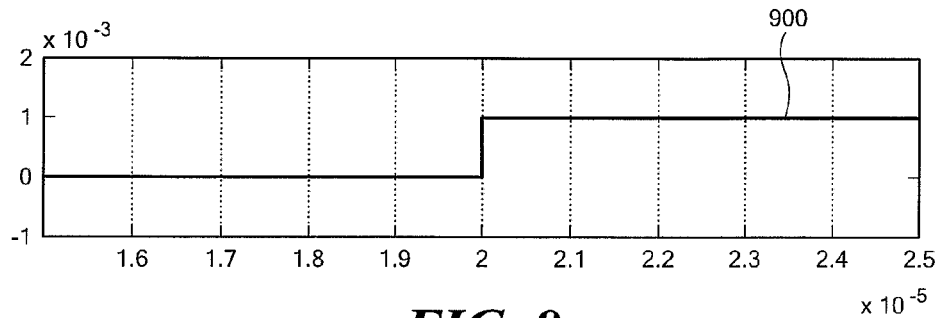
FIG. 9 shows an illustrative waveform representing a magnetic step disturbance.
Figure 9A:
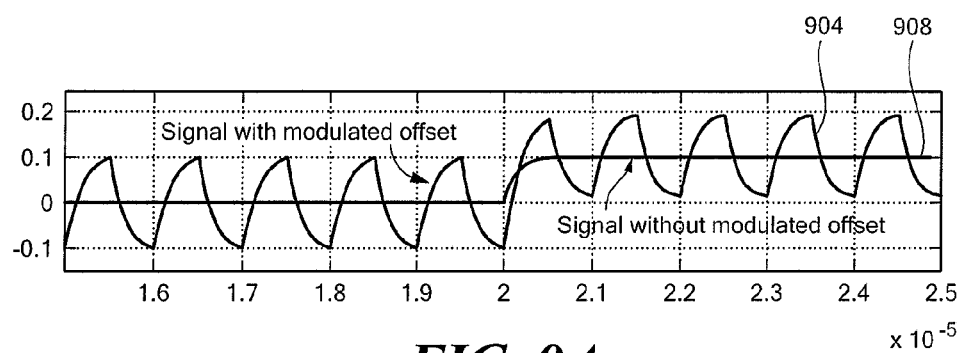
FIG. 9A shows illustrative output signals of the low pass filter of the inventive chopped Hall effect sensor in response to the step disturbance of FIG. 9, one where a Hall offset voltage exists and one with no Hall offset voltage.

Referring to FIG. 9, a waveform 900 representing an illustrative magnetic step disturbance is shown. FIG. 9A shows an illustrative step response of the anti-aliasing filter of the inventive Hall effect sensor, for example of filter 38 of FIG. 1, filter 144 of FIG. 4, filter 244 of FIG. 5 and filter 544 of FIG. 8, for a sensor having an amplifier bandwidth on the order of 250 KHz in response to the input step disturbance of FIG. 9.

Figure 9B:
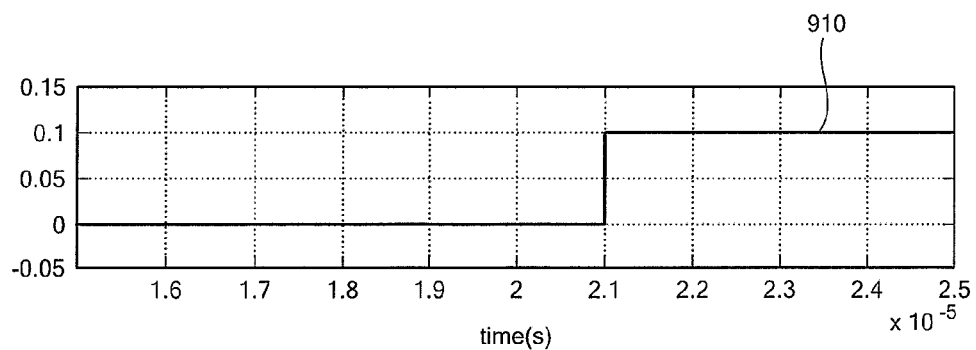
FIG. 9B shows the response of the selective filter of the inventive chopped Hall effect sensor to the input step disturbance of FIG. 9.

In particular, the output of the anti-aliasing filter is shown in FIG. 9A both for the case where a Hall offset voltage exists (as labeled 904) and for the case where there is no Hall offset voltage (as labeled 908). And FIG. 9B shows an illustrative step response 910 of the selective filter of the inventive chopped Hall effect sensor, for example of filter 40 of FIG. 1, filter 150 of FIG. 4, filter 250 of FIG. 5, and filter 550 of FIG. 8 in response to the input step disturbance of FIG. 9. As can be seen in FIG. 9, the selective filter introduces a delay of only one clock cycle.

In summary, the above-described Hall effect sensors 10 of FIG. 1, 100 of FIG. 4, 200 of FIG. 5, and 500 of FIG. 8 provide an effective circuit topology to remove undesirable Hall and amplifier offset signal components and provide the recovered magnetic signal component without ripple, without fold-back noise and with a fast response time. The selective filter averages the ripple, thereby completely removing it, without introducing significant delay (just $1/f_{CLK}$) The anti-aliasing low pass filter prevents noise fold-back, and a fast step response time is achieved by proper design considerations including selection of the clock signal frequency $f_{CLK}$ and the anti-aliasing filter cutoff frequency.

All references cited herein are hereby incorporated herein by reference in their entirety.

Having described preferred embodiments of the invention, it will now become apparent to one of ordinary skill in the art that other embodiments incorporating their concepts may be used.

For example, while the Hall effect sensor embodiments described herein have the Hall plate modulation circuit operating at the same modulation frequency as the signal modulation performed by the amplifier stage, it will be appreciated by those of ordinary skill in the art that, in certain instances, it may be desirable to modulate the Hall offset signal component at one frequency and the amplifier offset at a different frequency. In this case, the modulation frequencies must be far enough separated and the selective filter must be tuned to both frequencies in order to properly demodulate the signals and keep them separated.

It will also be appreciated by those of ordinary skill in the art that Hall effect sensors according to the invention may include more tan one (i.e., N) Hall plates for providing respective current or voltage output signals in various arithmetic combinations of the sensed magnetic field. In this case, N modulation circuits are provided, each processing the output signal of a respective Hall plate and providing an output signal for coupling to a summing node for further processing as described above in connection with the various embodiments of the invention.

It is felt therefore that these embodiments should not be limited to disclosed embodiments, but rather should be limited only by the spirit and scope of the appended claims.

What is claimed is:

1. A Hall effect sensor comprising:
    a Hall element having an output at which is provided a Hall output signal that varies in response to a magnetic field, the Hall output signal comprising a magnetic signal component and an offset signal component;
    a Hall plate modulation circuit having an input responsive to the Hall output signal and having an output at which is provided a modulation circuit output signal, wherein the Hall plate modulation circuit is operable to modulate the magnetic signal component or the offset signal component at a modulation frequency $f_{CLK}$;
    an amplifier having an input responsive to the Hall plate modulation circuit output signal and an output at which is provided an amplifier output signal; and
    a filter having an input responsive to the amplifier output signal and an output at which is provided a sensor output signal, wherein the filter comprises an anti-aliasing filter and a discrete time selective filter tuned at the modulation frequency to remove the offset signal component, wherein the anti-aliasing filter provides a bandwidth limited signal for filtering by the selective filter, wherein the anti-aliasing filter removes frequency components above a predetermined frequency selected to prevent aliasing by the discrete time selective filter.

2. The Hall effect sensor of claim 1 wherein the amplifier is a chopped amplifier.

3. The Hall effect sensor of claim 2 wherein the amplifier is chopped at the modulation frequency.

4. The Hall effect sensor of claim 2 wherein the amplifier is chopped at a different frequency than the modulation frequency.

5. The Hall effect sensor of claim 1 wherein the amplifier is a closed loop amplifier.

6. The Hall effect sensor of claim 5 wherein the amplifier comprises a feedback network that is adjustable to adjust the gain of the amplifier.

7. The Hall effect sensor of claim 1 wherein the Hall plate modulation circuit is operative to modulate the offset signal component and wherein the Hall effect sensor comprises an even number of modulation circuits between the output of the Hall plate modulation circuit and the input of the filter.

8. The Hall effect sensor of claim 7 wherein the amplifier comprises:
    a summing node having a first input coupled to the output of the Hall plate modulation circuit, a second, feedback input, and an output;
    a first modulation circuit having an input coupled to the output of the summing node and an output;
    a gain stage having an input coupled to the output of the first modulation circuit and an output;
    a second modulation circuit having an input coupled to the output of the gain stage and an output; and
    a feedback network having an input coupled to the filter and an output coupled to the second input of the summing node.

9. The Hall effect sensor of claim 8 wherein the input of the feedback network is coupled to a selected one of an input of the anti-aliasing filter or an output of the anti-aliasing filter.

10. The Hall effect sensor of claim 8 wherein the input of the feedback network is coupled to an output of the selective filter.

11. The Hall effect sensor of claim 8 wherein the feedback network is chopped.

12. The Hall effect sensor of claim 1 wherein the Hall plate modulation circuit is operative to modulate the magnetic signal component and wherein the Hall effect sensor comprises an odd number of modulation circuits between the output of the Hall plate modulation circuit and the input of the filter.

13. The Hall effect sensor of claim 12 wherein the amplifier comprises:
    a summing node having an input and an output;
    a first modulation circuit having an input coupled to the output of the summing node and an output;
    a gain stage having an input coupled to the output of the Hall plate modulation circuit and to the output of the first modulation circuit and an output;
    a second modulation circuit having an input coupled to the output of the gain stage and an output coupled to the filter; and
    a feedback network having an input coupled to the filter and an output coupled to the input of the summing node.

14. The Hall effect sensor of claim 13 wherein the input of the feedback network is coupled to a selected one of an input of the anti-aliasing filter or an output of the anti-aliasing filter.

15. The Hall effect sensor of claim 13 wherein the input of the feedback network is coupled to an output of the selective filter.

16. The Hall effect sensor of claim 12 wherein the amplifier comprises:
a summing node having an input and an output;
a gain stage having an input coupled to the output of the Hall plate modulation circuit and to the output of the summing node and an output;
a first modulation circuit having an input coupled to the output of the gain stage and an output coupled to the filter; and
a feedback network having an input coupled to the filter and an output coupled to the input of the summing node, wherein the feedback network is chopped.

17. The Hall effect sensor of claim 16 wherein the input of the feedback network is coupled to an input of the anti-aliasing filter.

18. The Hall effect sensor of claim 16 wherein the input of the feedback network is coupled to an output of the anti-aliasing filter.

19. The Hall effect sensor of claim 16 wherein the input of the feedback network is coupled to an output of the selective filter.

20. The Hall effect sensor of claim 1 wherein the anti-aliasing filter has an input responsive to the amplifier output signal and an output at which a low-pass filtered signal is provided and wherein the selective filter has an input coupled to the output of the anti-aliasing filter and an output at which a selective filter output signal is provided and wherein the selective filter comprises:
a plurality of sample and hold circuits arranged in pairs, each sample and hold circuit having an input coupled to the output of the anti-aliasing filter and an output; and
an averaging circuit having a plurality of inputs each coupled to the output of a respective one of the sample and hold circuits and an output at which the selective filter output signal is provided, wherein each of the sample and hold circuits samples the low-pass filtered signal at the modulation frequency and at a phase separated from the phase of the other sample and hold circuit of the same pair by 180 degrees and at a phase arbitrarily separated from the phase of the sample and hold circuits of the other pairs.

21. The Hall effect sensor of claim 20 wherein the selective filter output signal comprises a plurality of signal averages, each signal average being based on samples of the anti-aliasing filter output signal taken within a single cycle of a modulation clock signal having the modulation frequency.

22. The Hall effect sensor of claim 20 wherein the selective filter output signal comprises a plurality of signal averages, each signal average being based on a plurality of samples of the anti-aliasing filter output signal used to provide a previous signal average and a new sample of the anti-aliasing filter output signal.

23. The Hall effect sensor of claim 1 wherein the anti-aliasing filter has an input responsive to the amplifier output signal and an output at which a low-pass filtered signal is provided and wherein the selective filter has an input coupled to the output of the anti-aliasing filter and an output at which a selective filter output signal is provided and wherein the selective filter comprises:
a first sample and hold circuit having an input coupled to the output of the anti-aliasing filter and an output;
a second sample and hold circuit having an input coupled to the output of the anti-aliasing filter and an output; and
an averaging circuit having inputs coupled to the outputs of the first and second sample and hold circuits and an output at which the selective filter output signal is provided, wherein the first sample and hold circuit samples the low-pass filtered signal at times $t=t0+N \cdot T_{SF}$ and wherein the second sample and hold circuit samples the low-pass filtered signal at times $t=t0+(N+1) \cdot T_{SF}$, wherein t0 is an arbitrary time, N is an integer and $T_{SF}$ is $1/(2 \cdot f_{CLK})$, where $f_{CLK}$ is the modulation frequency.

24. The Hall effect sensor of claim 1 wherein the filter further comprises a smoothing filter.

25. The Hall effect sensor of claim 1 further comprising:
a plurality of Hall elements, each having an output at which is provided a Hall output signal that varies in response to a magnetic field;
a plurality of modulation circuits, each having an input responsive to the Hall output signal from a respective one of the plurality of Hall elements and an output at which is provided a modulation circuit output signal; and
an element responsive to each of the modulation circuit output signals for providing the modulation circuit output signal to the amplifier as a mathematical combination of the plurality of modulation output signals.

* * * * *

UNITED STATES PATENT AND TRADEMARK OFFICE
CERTIFICATE OF CORRECTION

| | | |
|---|---|---|
| PATENT NO. | : 7,425,821 B2 | Page 1 of 1 |
| APPLICATION NO. | : 11/550849 | |
| DATED | : September 16, 2008 | |
| INVENTOR(S) | : Gerardo Monreal et al. | |

It is certified that error appears in the above-identified patent and that said Letters Patent is hereby corrected as shown below:

Col. 2, line 67, delete "circuit the" and replace with -- circuit, the --.

Col. 3, line 39, delete "for switched" and replace with -- for the switched --.

Col. 14, line 22, delete "FIG. 7B signals" and replace with -- FIG. 7B, signals --.

Col. 16, line 49, delete "of the any" and replace with -- of any --.

Col. 17, line 18, delete "(just $1/f_{CLK}$)" and replace with -- (just $1/f_{CLK}$). --.

Signed and Sealed this

Thirtieth Day of June, 2009

JOHN DOLL
*Acting Director of the United States Patent and Trademark Office*